(12) United States Patent
Tseng et al.

(10) Patent No.: US 12,266,412 B2
(45) Date of Patent: Apr. 1, 2025

(54) CONTENT ADDRESSABLE MEMORY AND CONTENT ADDRESSABLE MEMORY CELL

(71) Applicant: Faraday Technology Corp., Hsinchu (TW)

(72) Inventors: Yi-Hsin Tseng, Hsinchu (TW); Chi-Chang Shuai, Hsinchu (TW); Yen-Yao Wang, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 204 days.

(21) Appl. No.: 18/323,430

(22) Filed: May 25, 2023

(65) Prior Publication Data

US 2024/0355408 A1 Oct. 24, 2024

(30) Foreign Application Priority Data

Apr. 24, 2023 (TW) ................................. 112115137

(51) Int. Cl.
*G11C 15/04* (2006.01)
*G11C 29/44* (2006.01)
*G11C 15/00* (2006.01)

(52) U.S. Cl.
CPC .......... *G11C 29/4401* (2013.01); *G11C 15/04* (2013.01); *G11C 15/00* (2013.01)

(58) Field of Classification Search
CPC ...... G11C 29/4401; G11C 15/04; G11C 15/00
USPC ..................................................... 365/49.11
See application file for complete search history.

(56) References Cited

U.S. PATENT DOCUMENTS 6,657,878 B2 12/2003 Lien et al.
6,865,098 B1 3/2005 Ichiriu et al.
7,274,580 B2 9/2007 Kang
2001/0056557 A1* 12/2001 Kawagoe ............... G11C 29/72
714/710
2006/0092725 A1* 5/2006 Min ...................... G11C 29/789
365/200
2013/0083612 A1* 4/2013 Son .................... G11C 29/4401
365/200
2019/0096508 A1* 3/2019 Kim ......................... G11C 8/08

FOREIGN PATENT DOCUMENTS

TW 481794 4/2002
TW 200522077 7/2005

OTHER PUBLICATIONS

"Notice of allowance of Taiwan Counterpart Application", issued on Apr. 8, 2024, p. 1-p. 4.

* cited by examiner

*Primary Examiner* — Ly D Pham
(74) *Attorney, Agent, or Firm* — JCIPRNET

(57) ABSTRACT

A content addressable memory (CAM) and a CAM cell are provided. The CAM includes a memory cell array and a disabling circuit. The memory cell array includes a plurality of CAM cells, wherein each of the CAM cells includes a memory cell circuit and a comparison circuit. When the CAM cells in a first column of the memory cell array are normal, the disabling circuit enables the comparison circuits of the CAM cells in the first column, so that the comparison circuits in the first column respectively present the comparison results on different match lines. When any one of the CAM cells in the first column is defective, the disabling circuit disables the comparison circuits of the CAM cells in the first column, so that the disabled comparison circuits does not affect the different match lines.

13 Claims, 10 Drawing Sheets

CONTENT ADDRESSABLE MEMORY AND CONTENT ADDRESSABLE MEMORY CELL

CROSS-REFERENCE TO RELATED APPLICATION

This application claims the priority benefit of Taiwan application serial no. 112115137, filed on Apr. 24, 2023. The entirety of the above-mentioned patent application is hereby incorporated by reference herein and made a part of this specification.

BACKGROUND

Technical Field

The disclosure relates to a memory, and particularly relates to a content addressable memory (CAM) and a content addressable memory cell.

Description of Related Art

A content addressable memory (CAM) is a special type of memory. The content addressable memory includes general content addressable memory and ternary content addressable memory (TCAM). The content addressable memory may compare input search data with stored data and return match information through a match line. When there are defective memory cells in the content addressable memory, the defective memory cells may wrongly affect a signal of the match line.

SUMMARY

The disclosure is directed to a content addressable memory (CAM) and a content addressable memory cell, which avoid a defective comparison circuit and cell element from wrongly affecting a match line.

In an embodiment of the disclosure, the content addressable memory (CAM) includes a memory cell array and a disabling circuit. The memory cell array includes multiple CAM cells, wherein each of the CAM cells includes a memory cell circuit and a comparison circuit. The disabling circuit is coupled to the comparison circuits of the CAM cells in a first column of the memory cell array, wherein the disabling circuit is controlled by a repair signal. When the repair signal indicates that the CAM cells in the first column are normal, the disabling circuit enables the comparison circuits of the CAM cells in the first column, so that the comparison circuits in the first column respectively present comparison results on different match lines. When the repair signal indicates that any one of the CAM cells in the first column is defective, the disabling circuit disables the comparison circuits of the CAM cells in the first column, so that the disabled comparison circuits do not affect the different match lines.

In an embodiment of the disclosure, the CAM cell includes a memory cell circuit, a comparison circuit and a disabling circuit. The comparison circuit is coupled to the memory cell circuit to receive stored bit data. The comparison circuit is coupled to a first search line to receive search bit data. The comparison circuit is further coupled to a match line. The disabling circuit is coupled to the comparison circuit, wherein the disabling circuit is controlled by a repair signal. When the repair signal indicates that the CAM cell is normal, the disabling circuit enables the comparison circuit, so that the comparison circuit presents a comparison result of the stored bit data and the search bit data on the match line. When the repair signal indicates that the CAM cell is defective, the disabling circuit disables the comparison circuit, so that the disabled comparison circuit does not affect the match line.

Based on the above description, the CAM described in the embodiments of the disclosure is configured with a disabling circuit. In some embodiments, each of the CAM cells has its own dedicated disabling circuit. When the repair signal indicates that the CAM cell is defective, the disabling circuit may disable the comparison circuit of the CAM cell. For example, the disabling circuit may cut off a discharge/charge path to the match line in the comparison circuit to disable the comparison circuit. Therefore, the disabled comparison circuit will not affect signal transmission of the match line. In other embodiments, multiple CAM cells (for example, all of the CAM cells in the first column of the memory cell array) may share one disabling circuit. When the repair signal indicates that any one of the CAM cells in the same column is defective, the disabling circuit may disable the comparison circuits of all of the CAM cells in the same column.

To make the aforementioned more comprehensible, several embodiments accompanied with drawings are described in detail as follows.

DESCRIPTION OF THE EMBODIMENTS

Figure 1:
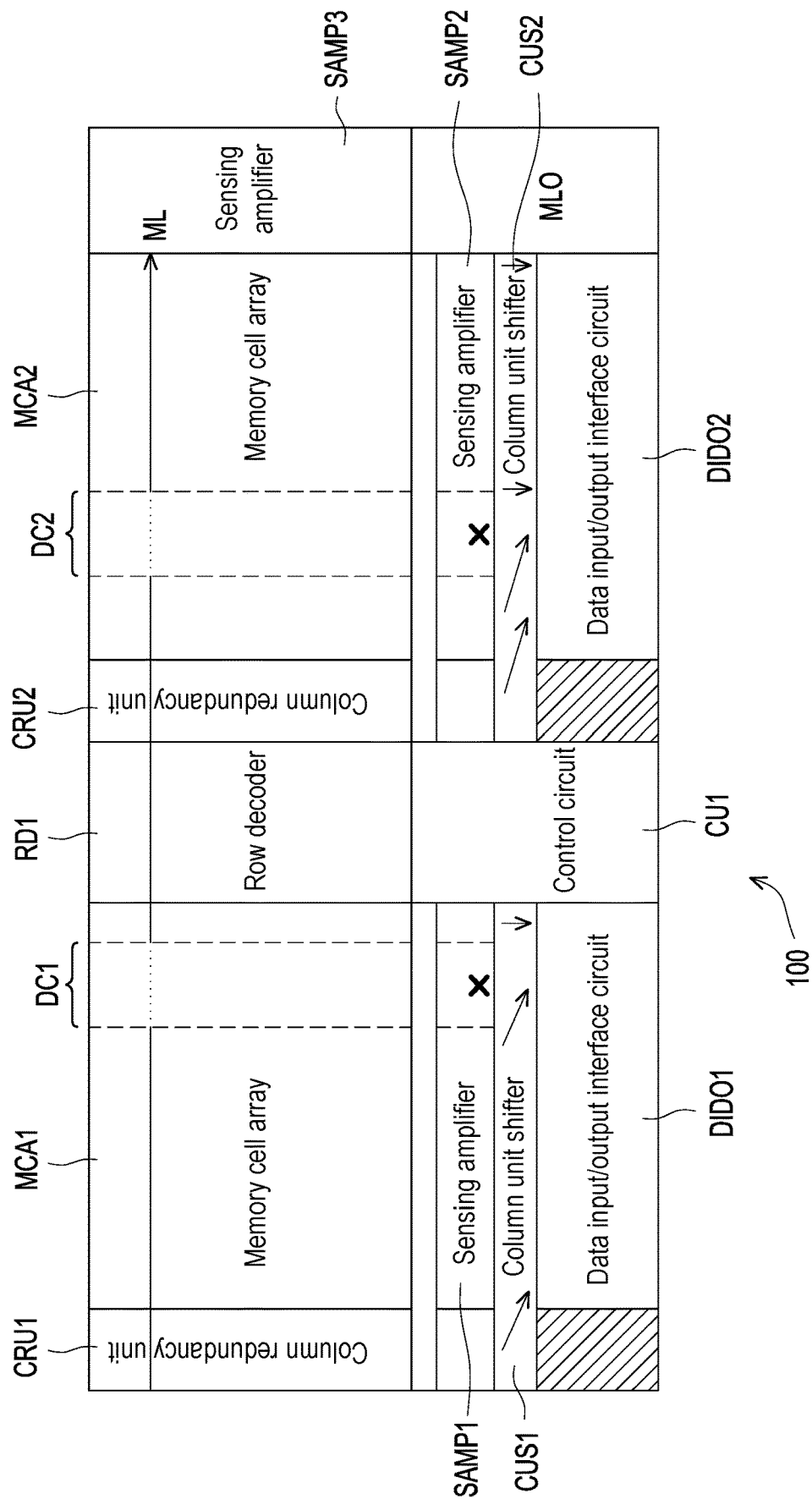
FIG. 1 is a schematic circuit block diagram of a content addressable memory (CAM) according to an embodiment of the disclosure.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Furthermore, "first", "second", etc. mentioned in the specification and the claims are merely used to name discrete components and should not be regarded as limiting the upper or lower bound of the number of the components, nor is it used to define a manufacturing order or setting order of the components. Moreover, wherever possible, components/members/steps using the same referential numbers in the drawings and description refer to the same or like parts. Components/members/steps using the same referential numbers or using the same terms in different embodiments may cross-refer related descriptions.

FIG. 1 is a schematic circuit block diagram of a content addressable memory (CAM) 100 according to an embodiment of the disclosure. The CAM 100 includes memory cell arrays MCA1 and MCA2. The memory cell arrays MCA1 and MCA2 respectively include multiple CAM cells, wherein each of the CAM cells includes a memory cell circuit and a comparison circuit (not shown in FIG. 1, which will be described in detail later). The CAM 100 further includes column redundancy units CRU1 and CRU2 for repairing defective columns in the memory cell arrays MCA1 and MCA2. The content addressable memory 100 further includes a control circuit CU1 and a row decoder RD1. The control circuit CU1 is configured to generate timing control signals required for all operations. The row decoder RD1 is connected to the memory cell circuits of all CAM cells in the memory cell arrays MCA1 and MCA2 through multiple word lines (WL). Based on the control of the control circuit CU1, the row decoder RD1 generates word line signals for performing write or read operations.

The CAM 100 further includes sensing amplifiers SAMP1 and SAMP2. The sensing amplifiers SAMP1 and SAMP2 are connected to the memory cell circuits of all CAM cells in the memory cell arrays MCA1 and MCA2 through multiple bit lines (BL) and/or multiple inverted bit lines. The sensing amplifiers SAMP1 and SAMP2 are configured to read out stored data of the memory cell circuits in the memory cell arrays MCA1 and MCA2 during a read operation. The CAM 100 further includes data input/output interface circuits DIDO1 and DIDO2. The data input/output interface circuits DIDO1 and DIDO2 respectively include a Y-MUX, a write circuit, a read circuit and a search circuit.

The CAM 100 further includes column unit shifters CUS1 and CUS2. The column unit shifter CUS1 is coupled between the sensing amplifier SAMP1 and the data input/output interface circuit DIDO1. When there is a defective column in the memory cell array MCA1 (such as a defective column DC1 shown in FIG. 1), the column unit shifter CUS1 discards the bit line and the search line corresponding to the defective column, and selects a redundancy column from the column redundancy unit CRU1, and changes a data location during data input or output. The data input/output interface circuit DIDO1 may obtain a bit line signal (read data) and a search line signal (input data) of the memory cell array MCA1 through the column unit shifter CUS1 and the sensing amplifier SAMP1, and/or write data into the memory cell array MCA1 through the column unit shifter CUS1 and the bit line. The column unit shifter CUS2 is coupled between the sensing amplifier SAMP2 and the data input/output interface circuit DIDO2. When there is a defective column in the memory cell array MCA2 (such as a defective column DC2 shown in FIG. 1), the column unit shifter CUS2 discards the bit line and the search line corresponding to the defective column, and selects a redundancy column from the column redundancy unit CRU2, and changes a data location during data input or output. The data input/output interface circuit DIDO2 may obtain a bit line signal (read data) and a search line signal (input data) of the memory cell array MCA2 through the column unit shifter CUS2 and the sensing amplifier SAMP2, and/or write data into the memory cell array MCA2 through the column unit shifter CUS2 and the bit line.

The content addressable memory 100 further includes a sensing amplifier SAMP3.

The sensing amplifier SAMP3 is connected to the comparison circuits of all CAM cells in the memory cell arrays MCA1 and MCA2 through multiple match lines (for example, a match line ML shown in FIG. 1). The sensing amplifier SAMP3 may read out comparison results of the CAM cells through the match lines during a compare operation. The CDM 100 further includes a match line state interface circuit MLO. The CDM 100 may obtain match line states (comparison results) of the memory cell arrays MCA1 and MCA2 through the sensing amplifier SAMP3.

The CAM 100 is further configured with disabling circuits (not shown in FIG. 1, which will be described in detail later). In some embodiments (for example, the embodiment shown in FIG. 2), each of the CAM cells in the memory cell arrays MCA1 and MCA2 has its own dedicated disabling circuit. When the dedicated cell is defective, the disabling circuit may disable the comparison circuit of the CAM cell. For example, the disabling circuit may cut off a discharge/charge path to the match line in the comparison circuit to disable the comparison circuit. Therefore, the disabled comparison circuit will not affect signal transmission of the match line. In other embodiments (for example, an embodiment of FIG. 11), multiple CAM cells (for example, all of the CAM cells in a first column of the memory cell array) may share one disabling circuit.

Figure 2:
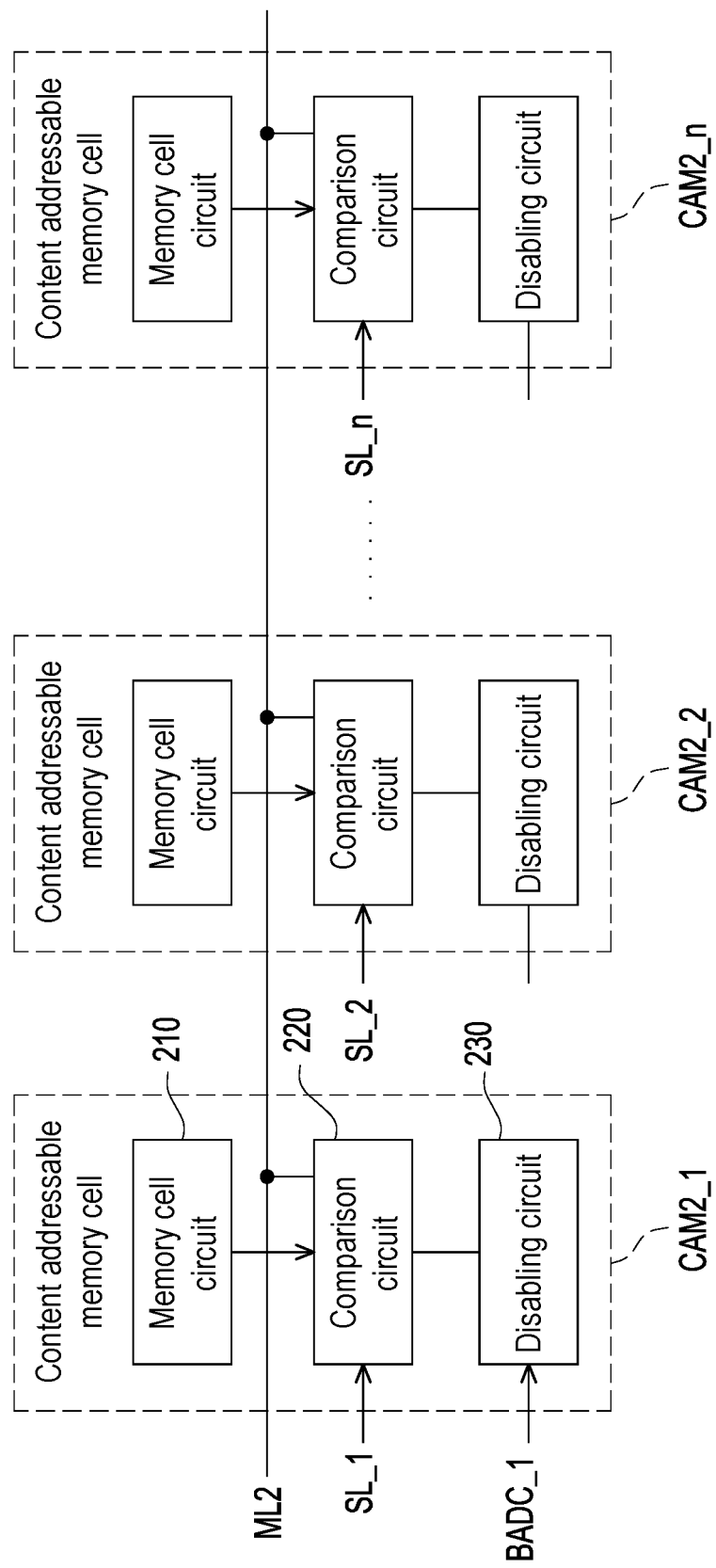
FIG. 2 is a schematic circuit block diagram of a CAM cell according to an embodiment of the disclosure.

FIG. 2 is a schematic circuit block diagram of a CAM cell according to an embodiment of the disclosure. FIG. 2 shows CAM cells CAM2_1, CAM2_2, CAM2_n in a row of the memory cell array. The CAM cells CAM2_1-CAM2_n shown in FIG. 2 may be used as an implementation example of a row of CAM cells in the memory cell array MCA1 or MCA2 shown in FIG. 1. For other rows in the memory cell array, reference may be made to the related descriptions of the row shown in FIG. 2, and details thereof are not repeated here. The CAM cells CAM2_1-CAM2_n may be ternary CAM (TCAM) cells or other types of CAM cells. The CAM cells CAM2_1-CAM2_n are respectively coupled to different search lines, such as search lines SL_1, SL_2, SL_n shown in FIG. 2.

The CAM cells CAM2_1-CAM2_n are further coupled to a match line ML2. The CAM cells CAM2_1-CAM2_n may compare the stored bit data with the search bit data of the search lines SL_1-SL_n, and present comparison results on the match line ML2. In some embodiments, the match line ML2 is precharged to a high logic level before performing the comparison operation. In the comparison operation, when the comparison result of any one of the CAM cells CAM2_1-CAM2_n is "mismatch", a voltage level of the match line ML2 is pulled down to a low logic level. In some other embodiments, the match line ML2 is pre-discharged to a low logic level before performing the comparison operation. In the comparison operation, when the comparison result of any one of the CAM cells CAM2_1-CAM2_n is "mismatch", the voltage level of the match line ML2 is pulled up to the high logic level.

In the embodiment shown in FIG. 2, each of the CAM cells includes a memory cell circuit, a comparison circuit and a disabling circuit. Taking the CAM cell CAM2_1 as an example, it includes a memory cell circuit 210, a comparison circuit 220 and a disabling circuit 230. For other CAM cells (for example, the CAM cells CAM2_2-CAM2_n) in the memory cell array, reference may be made to the related description of the CAM cell CAM2_1, and details thereof are not repeated here.

The comparison circuit 220 is coupled to the memory cell circuit 210 to receive the stored bit data. The comparison circuit 220 is coupled to a search line SL_1 to receive search bit data. The comparison circuit 220 may compare the stored bit data from the memory cell circuit 210 with the search bit data from the search line SL_1. The comparison circuit 220 is further coupled to the match line ML2. The disabling circuit 230 is coupled to the comparison circuit 220 to determine whether to disable the ability of the comparison circuit 220 to affect the match line ML2. The disabling circuit 230 is controlled by a repair signal BADC_1 from the control circuit CU1. When the repair signal BADC_1 indicates that the CAM cell CAM2_1 is normal, the disabling circuit 230 may enable (enable) the comparison circuit 220, so that the comparison circuit 220 presents a comparison result of the stored bit data and the search bit data on the match line ML2. When the repair signal BADC_1 indicates that the CAM cell CAM2_1 is defective, the disabling circuit 230 may disable the comparison circuit 220, so that the comparison circuit 220 does not affect the match line ML2. For example, the disabling circuit 230 may cut off a discharge path (or charge path) to the match line ML2 in the comparison circuit 220 to disable the ability of the comparison circuit 220 to affect the match line ML2. Therefore, the disabled comparison circuit 220 will not affect a state of the match line ML2.

Figure 3:
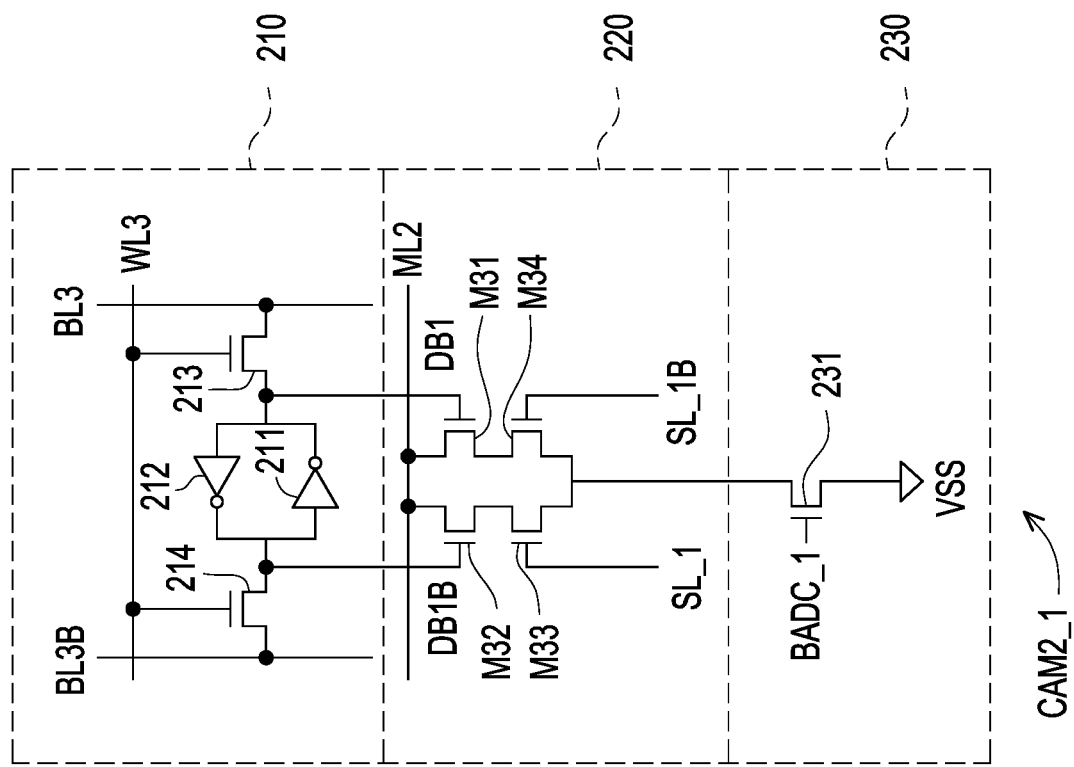
FIG. 3 is a schematic circuit diagram of a CAM cell according to an embodiment of the disclosure.

FIG. 3 is a schematic circuit diagram of the CAM cell CAM2_1 according to an embodiment of the disclosure. The CAM cell CAM2_1 shown in FIG. 3 may be used as an implementation example of the CAM cell CAM2_1 shown in FIG. 2. In the embodiment shown in FIG. 3, the memory cell circuit 210 includes a NOT gate 211, a NOT gate 212, a switch 213 and a switch 214. An output terminal of the NOT gate 211 is coupled to the comparison circuit 220 to provide stored bit data DB1. An input terminal of the NOT gate 212 is coupled to the output terminal of the NOT gate 211. An output terminal of the NOT gate 212 is coupled to an input terminal of the NOT gate 211. An output terminal of the NOT gate 212 is further coupled to the comparison circuit 220 to provide inverted stored bit data DB1B. A first terminal of the switch 213 is coupled to the output terminal of the NOT gate 211 for receiving the stored bit data DB1. A second terminal of the switch 213 is coupled to a bit line BL3. A control terminal of the switch 213 is coupled to a word line WL3. A first terminal of the switch 214 is coupled to the output terminal of the NOT gate 212 for receiving the inverted stored bit data DB1B. A second terminal of the switch 214 is coupled to an inverted bit line BL3B. A control terminal of the switch 214 is coupled to the word line WL3.

In the embodiment shown in FIG. 3, the comparison circuit 220 includes a transistor M31, a transistor M32, a transistor M33, and a transistor M34. A first terminal of the transistor M31 and a first terminal of the transistor M32 are coupled to the match line ML2. A control terminal of the transistor M31 is coupled to the memory cell circuit 210 for receiving the stored bit data DB1. A control terminal of the transistor M32 is coupled to the memory cell circuit 210 for receiving the inverted stored bit data DB1B. A first terminal of the transistor M33 is coupled to a second terminal of the transistor M32. A second terminal of the transistor M33 is coupled to the disabling circuit 230. A control terminal of the transistor M33 is coupled to the search line SL_1 to receive the search bit data. A first terminal of the transistor M34 is coupled to a second terminal of the transistor M31. A second terminal of the transistor M34 is coupled to the disabling circuit 230. A control terminal of the transistor M34 is coupled to a search line SL_1B to receive inverted search bit data.

In the embodiment shown in FIG. 3, the disabling circuit 230 includes a switch 231. A first terminal of the switch 231 is coupled to the comparison circuit 220. Specifically, the first terminal of the switch 231 is coupled to the second terminal of the transistor M33 and the second terminal of the transistor M34. A second terminal of the switch 231 is coupled to a reference voltage line VSS. A control terminal of the switch 231 receives the repair signal BADC_1. When the repair signal BADC_1 indicates that the CAM cell CAM2_1 is normal, the switch 231 is turned on. The match line ML2 is precharged to a high logic level before the comparison operation. In the comparison operation, the comparison circuit 220 may compare the stored bit data DB1 with the search bit data of the search line SL_1. When the stored bit data DB1 matches the search bit data of the search line SL_1 (the comparison result of the comparison circuit 220 is "match"), the comparison circuit 220 does not affect the state of the match line ML2. When the stored bit data DB1 does not match the search bit data of the search line SL_1 (the comparison result of the comparison circuit 220 is "mismatch"), the comparison circuit 220 provides a discharge path (from ML2 to VSS through M31, M34 and 231, or from ML2 to VSS through M32, M33 and 231) to the match line ML2, so that the voltage level of the match line ML2 is pulled down to a low logic level.

When the repair signal BADC_1 indicates that the CAM cell CAM2_1 is defective, the switch 231 is turned off. At this time, the switch 231 may cut off the discharge path to the match line ML2 in the comparison circuit 220 to disable the comparison circuit 220. Therefore, the disabled comparison circuit 220 will not affect the state of the match line ML2.

Figure 4:
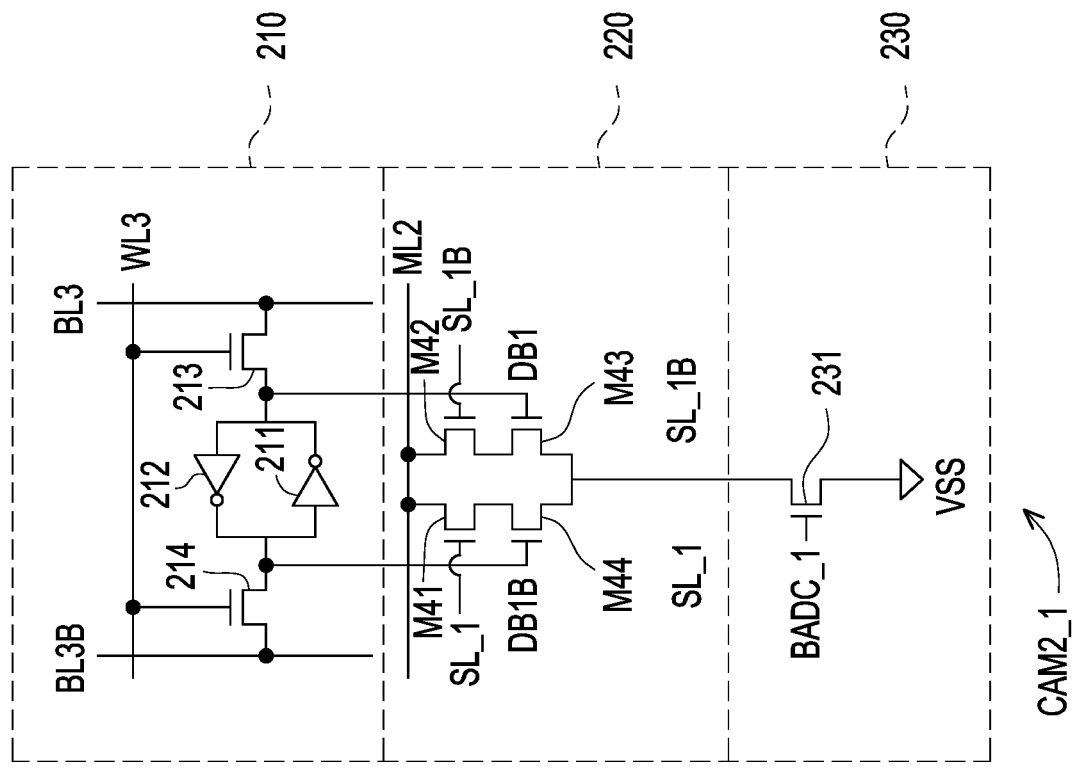
FIG. 4 is a schematic circuit diagram of the CAM cell according to another embodiment of the disclosure.

FIG. 4 is a schematic circuit diagram of the CAM cell CAM2_1 according to another embodiment of the disclosure. The CAM cell CAM2_1 shown in FIG. 4 may be used as another implementation example of the CAM cell CAM2_1 shown in FIG. 2. For the memory cell circuit 210 and the disabling circuit 230 shown in FIG. 4, reference may be made to the related descriptions of the memory cell circuit 210 and the disabling circuit 230 shown in FIG. 3, and details thereof are not repeated. In the embodiment shown in FIG. 4, the comparison circuit 220 includes a transistor M41, a transistor M42, a transistor M43 and a transistor M44. A first terminal of the transistor M41 and a first terminal of the transistor M42 are coupled to the match line ML2. A control terminal of the transistor M41 is coupled to the search line SL_1 for receiving the search bit data. A control terminal of the transistor M42 is coupled to the search line SL_1B for receiving the inverted search bit data. A first terminal of the transistor M43 is coupled to a second terminal of the transistor M42. A second terminal of the transistor M43 is coupled to the disabling circuit 230. A control terminal of the transistor M43 is coupled to the memory cell circuit 210 to receive the stored bit data DB1. A first terminal of the transistor M44 is coupled to a second terminal of the transistor M41. A second terminal of the transistor M44 is coupled to the disabling circuit 230. A control terminal of the transistor M44 is coupled to the memory cell circuit 210 to receive the inverted stored bit data DB1B.

In the embodiment shown in FIG. 4, a first terminal of the switch 231 is coupled to the second terminal of the transistor M43 and the second terminal of the transistor M44. When the repair signal BADC_1 indicates that the CAM cell CAM2_1 is normal, the switch 231 is turned on, so that the comparison circuit 220 presents the comparison result to the match line ML2. When the repair signal BADC_1 indicates that the CAM cell CAM2_1 is defective, the switch 231 is turned off. At this time, the switch 231 may cut off the discharge path to the match line ML2 in the comparison circuit 220 to disable the comparison circuit 220. Therefore, the disabled comparison circuit 220 will not affect the state of the match line ML2.

Figure 5:
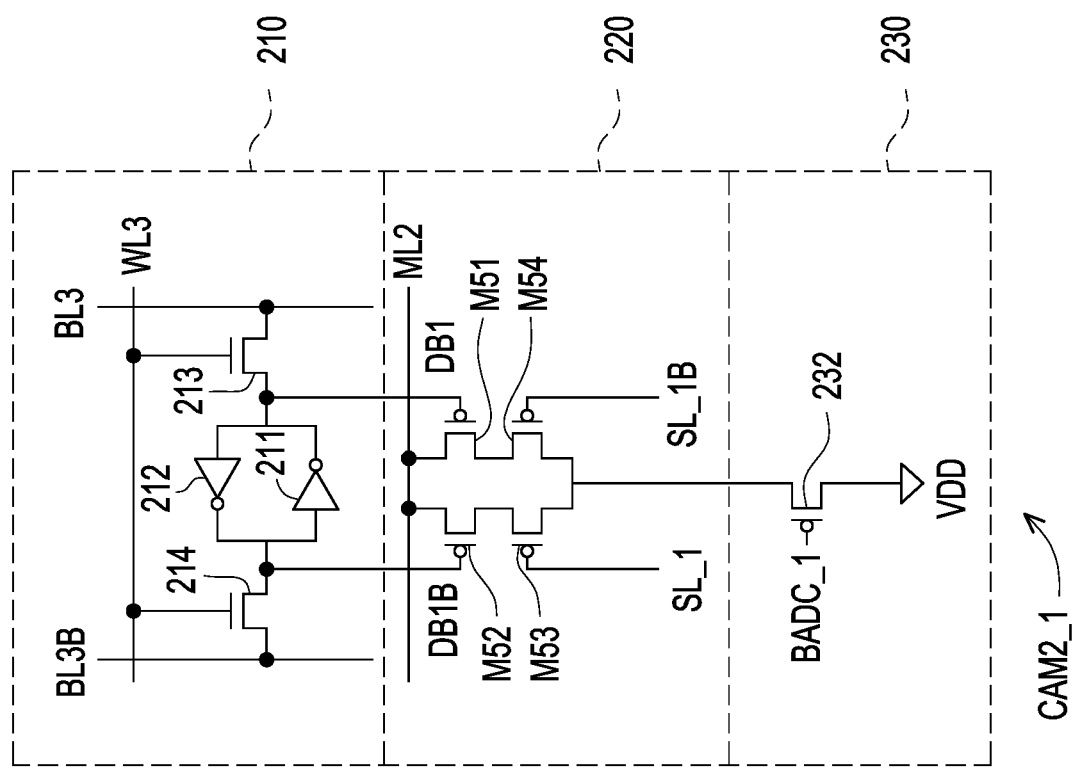
FIG. 5 is a schematic circuit diagram of the CAM cell according to still another embodiment of the disclosure.

FIG. 5 is a schematic circuit diagram of the CAM cell CAM2_1 according to still another embodiment of the disclosure. The CAM cell CAM2_1 shown in FIG. 5 may be used as still another implementation example of the CAM cell CAM2_1 shown in FIG. 2. For the memory cell circuit 210 shown in FIG. 5, reference may be made to the related description of the memory cell circuit 210 shown in FIG. 3, and details thereof are not repeated. In the embodiment shown in FIG. 5, the comparison circuit 220 includes a transistor M51, a transistor M52, a transistor M53 and a transistor M54. A first terminal of the transistor M51 and a first terminal of the transistor M52 are coupled to the match line ML2. A control terminal of the transistor M51 is coupled to the memory cell circuit 210 for receiving the stored bit data DB1. A control terminal of the transistor M52 is coupled to the memory cell circuit 210 for receiving the inverted stored bit data DB1B. A first terminal of the transistor M53 is coupled to a second terminal of the transistor M52. A second terminal of the transistor M53 is coupled to the disabling circuit 230. A control terminal of the transistor M53 is coupled to the search line SL_1 to receive the search bit data. A first terminal of the transistor M54 is coupled to a second terminal of the transistor M51. A second terminal of the transistor M54 is coupled to the disabling circuit 230. A control terminal of the transistor M54 is coupled to the search line SL_1B to receive the inverted search bit data.

In the embodiment shown in FIG. 5, the disabling circuit 230 includes a switch 232. A first terminal of the switch 232 is coupled to the comparison circuit 230. To be specific, the first terminal of the switch 232 is coupled to the second terminal of the transistor M53 and the second terminal of the transistor M54. A second terminal of the switch 232 is coupled to a power voltage line VDD. A control terminal of the switch 232 receives the repair signal BADC_1. When the repair signal BADC_1 indicates that the CAM cell CAM2_1 is normal, the switch 232 is turned on. The match line ML2 is pre-discharged to a low logic level before the comparison operation. In the comparison operation, the comparison circuit 220 may compare the stored bit data DB1 with the search bit data of the search line SL_1. When the stored bit data DB1 matches the search bit data of the search line SL_1 (the comparison result of the comparison circuit 220 is "match"), the comparison circuit 220 does not affect the state of the match line ML2. When the stored bit data DB1 does not match the search bit data of the search line SL_1 (the comparison result of the comparison circuit 220 is "mismatch"), the comparison circuit 220 provides a charge path to the match line ML2 (from VDD to ML2 through 232, M51 and M54, or from VDD to ML2 through 232. M52 and M53), so that the voltage level of the match line ML2 is pulled up to a high logic level.

When the repair signal BADC_1 indicates that the CAM cell CAM2_1 is defective, the switch 232 is turned off. At this time, the switch 232 may cut off the charge path to the match line ML2 in the comparison circuit 220 to disable the comparison circuit 220. Therefore, the disabled comparison circuit 220 will not affect the state of the match line ML2.

Figure 6:
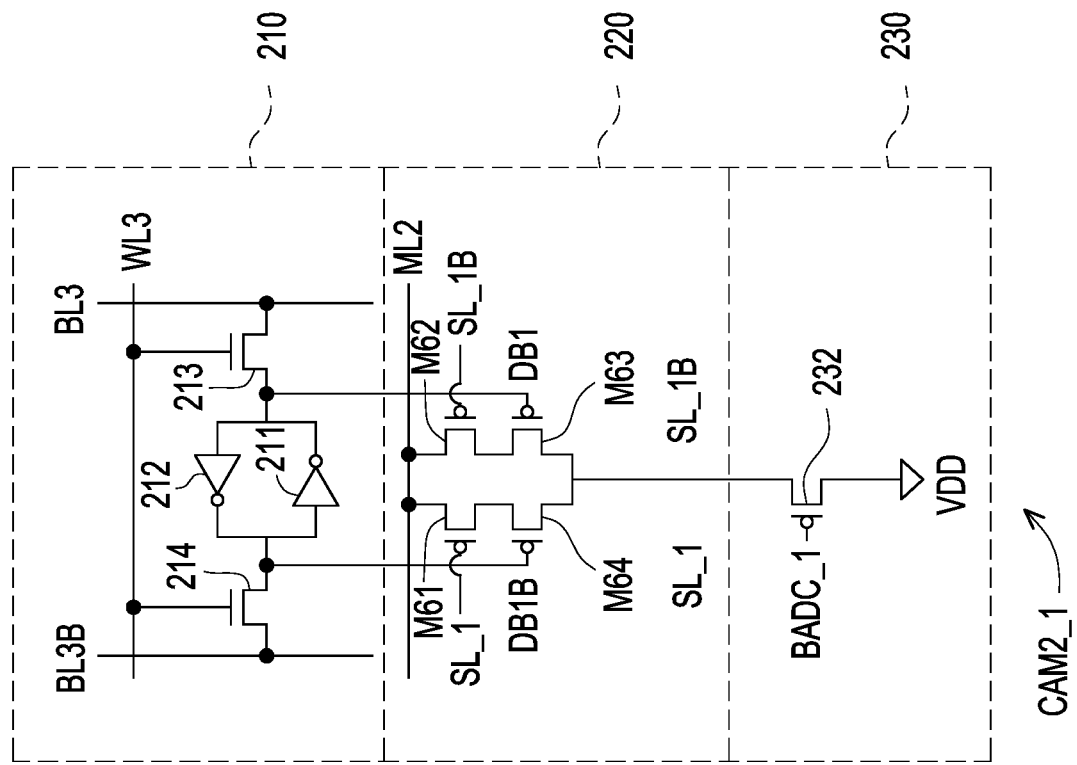
FIG. 6 is a schematic circuit diagram of the CAM cell according to still another embodiment of the disclosure.

FIG. 6 is a schematic circuit diagram of the CAM cell CAM2_1 according to still another embodiment of the disclosure. The CAM cell CAM2_1 shown in FIG. 6 may be used as still another implementation example of the CAM cell CAM2_1 shown in FIG. 2. For the memory cell circuit 210 and the disabling circuit 230 shown in FIG. 6, reference may be made to the related descriptions of the memory cell circuit 210 and the disabling circuit 230 shown in FIG. 5, and details thereof are not repeated. In the embodiment shown in FIG. 6, the comparison circuit 220 includes a transistor M61, a transistor M62, a transistor M63 and a transistor M64. A first terminal of the transistor M61 and a first terminal of the transistor M62 are coupled to the match line ML2. A control terminal of the transistor M61 is coupled to the search line SL_1 for receiving the search bit data. A control terminal of the transistor M62 is coupled to the search line SL_1B for receiving the inverted search bit data. A first terminal of the transistor M63 is coupled to a second terminal of the transistor M62. A second terminal of the transistor M63 is coupled to the disabling circuit 230. A control terminal of the transistor M63 is coupled to the memory cell circuit 210 to receive the stored bit data DB1. A first terminal of the transistor M64 is coupled to a second terminal of the transistor M61. A second terminal of the transistor M64 is coupled to the disabling circuit 230. A control terminal of the transistor M64 is coupled to the memory cell circuit 210 to receive the inverted stored bit data DB1B.

In the embodiment shown in FIG. 6, a first terminal of the switch 232 is coupled to the second terminal of the transistor M63 and the second terminal of the transistor M64. When the repair signal BADC_1 indicates that the CAM cell CAM2_1 is normal, the switch 232 is turned on, so that the comparison circuit 220 presents the comparison result to the match line ML2. When the repair signal BADC_1 indicates that the CAM cell CAM2_1 is defective, the switch 232 is turned off. At this time, the switch 232 may cut off the discharge path to the match line ML2 in the comparison circuit 220 to disable the comparison circuit 220. Therefore, the disabled comparison circuit 220 will not affect the state of the match line ML2.

Figure 7:
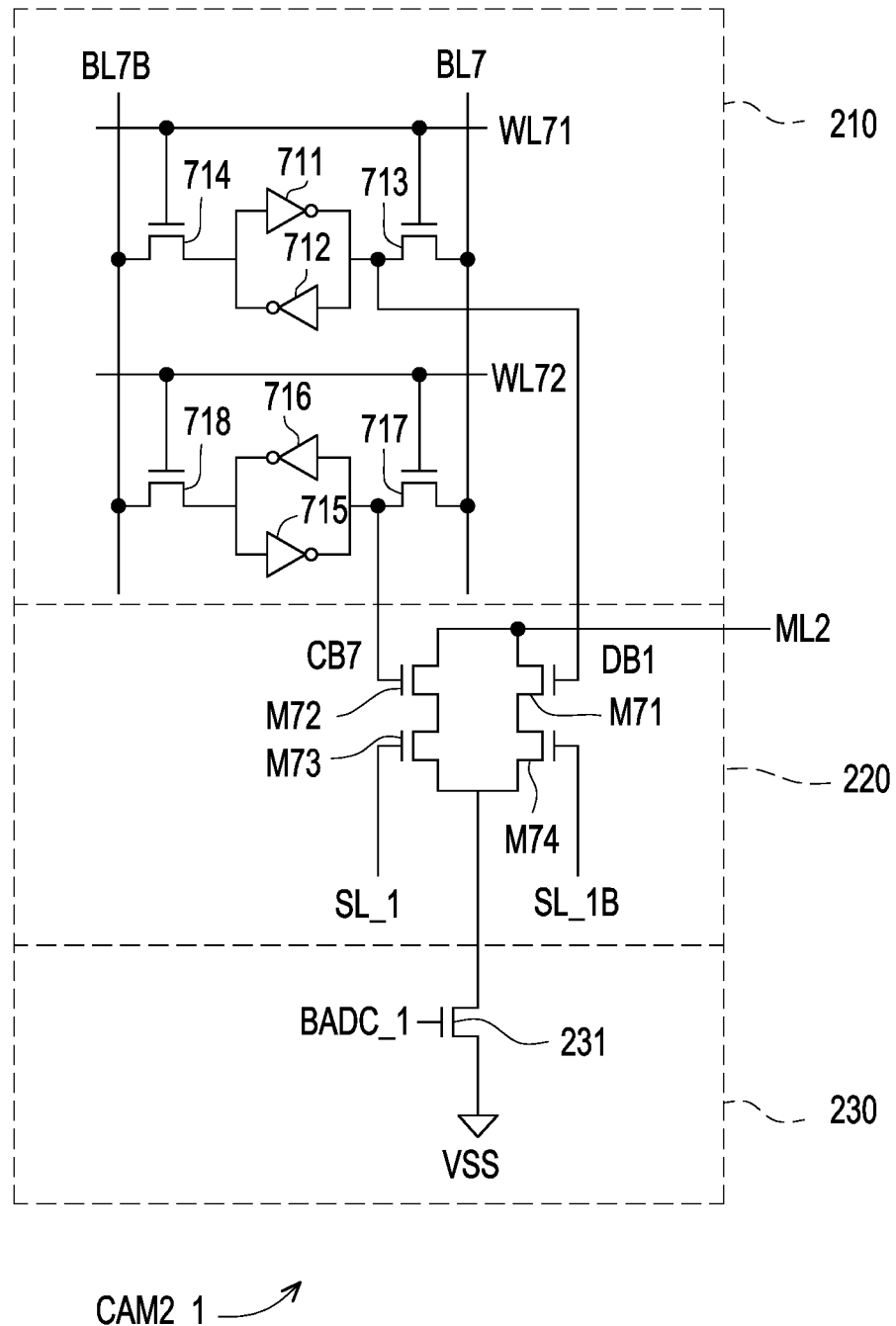
FIG. 7 is a schematic circuit diagram of the CAM cell according to still another embodiment of the disclosure.

FIG. 7 is a schematic circuit diagram of the CAM cell CAM2_1 according to still another embodiment of the disclosure. The CAM cell CAM2_1 shown in FIG. 7 may be used as still another implementation example of the CAM cell CAM2_1 shown in FIG. 2. For the disabling circuit 230 shown in FIG. 7, reference may be made to the related description of the disabling circuit 230 shown in FIG. 3, and details thereof are not repeated. In the embodiment shown in FIG. 7, the memory cell circuit 210 includes a NOT gate 711, a NOT gate 712, a switch 713, a switch 714, a NOT gate 715, a NOT gate 716, a switch 717 and a switch 718. An output terminal of the NOT gate 711 is coupled to the comparison circuit 220 to provide the stored bit data DB1. An input terminal of the NOT gate 712 is coupled to the output terminal of the NOT gate 711. An output terminal of the NOT gate 712 is coupled to an input terminal of the NOT gate 711. A first terminal of the switch 713 is coupled to the output terminal of the NOT gate 711 for receiving the stored bit data DB1. A second terminal of the switch 713 is coupled to a bit line BL7. A control terminal of the switch 713 is coupled to a word line WL71. A first terminal of the switch 714 is coupled to the output terminal of the NOT gate 712. A second terminal of the switch 714 is coupled to an inverted bit line BL7B. A control terminal of the switch 714 is coupled to the word line WL71. An output terminal of the NOT gate 715 is coupled to the comparison circuit 220 to provide care bit data CB7. An output terminal of the NOT gate 716 is coupled to an input terminal of the NOT gate 715. An input terminal of the NOT gate 716 is coupled to the output terminal of the NOT gate 715. A first terminal of the switch 717 is coupled to the output terminal of the NOT gate 715. A second terminal of the switch 717 is coupled to the bit line BL7. A control terminal of the switch 717 is coupled to a word line WL72. A first terminal of the switch 718 is coupled to the output terminal of the NOT gate 716. A second terminal of the switch 718 is coupled to the inverted bit line BL7B. A control terminal of the switch 718 is coupled to the word line WL72.

In the embodiment of FIG. 7, the comparison circuit 220 includes a transistor M71, a transistor M72, a transistor M73 and a transistor M74. A first terminal of the transistor M71 and a first terminal of the transistor M72 are coupled to the match line ML2. A control terminal of the transistor M71 is coupled to the memory cell circuit 210 to receive the stored bit data DB1. A control terminal of the transistor M72 is coupled to the memory cell circuit 210 to receive the care bit data CB7. A first terminal of the transistor M73 is coupled to a second terminal of the transistor M72. A second terminal of the transistor M73 is coupled to the disabling circuit 230. A control terminal of the transistor M73 is coupled to the search line SL_1 to receive the search bit data. A first terminal of the transistor M74 is coupled to a second terminal of the transistor M71. A second terminal of the transistor M74 is coupled to the disabling circuit 230. A control terminal of the transistor M74 is coupled to the search line SL_1B to receive the inverted search bit data.

In the embodiment of FIG. 7, a first terminal of the switch 231 is coupled to the second terminal of the transistor M73 and the second terminal of the transistor M74. When the repair signal BADC_1 indicates that the CAM cell CAM2_1 is normal, the switch 231 is turned on. The match line ML2 is precharged to the high logic level before the comparison operation. In the comparison operation, the comparison circuit 220 may compare the stored bit data DB1, the care bit data CB7, and the search bit data of the search lines SL_1 and SL_1B. When both of the stored bit data DB1 and the care bit data CB7 are logic "1", a state of the CAM cell CAM2_1 is a prohibited state. When both of the stored bit data DB1 and the care bit data CB7 are logic "0", the state of the CAM cell CAM2_1 is a don't care state. When the CAM cell CAM2_1 is in the don't care state, no matter what the search bit data of the search lines SL_1 and SL_1B is, the comparison result of the comparison circuit 220 is always "match" (the comparison circuit 220 will not affect the state of the match line ML2).

When the stored bit data DB1 is different from the care bit data CB7, the state of the CAM cell CAM2_1 is a comparison state. At this time, when the stored bit data DB1 matches the search bit data of the search line SL_1, the comparison result of the comparison circuit 220 is "match" (the comparison circuit 220 will not affect the state of the match line ML2). When the stored bit data DB1 does not match the search bit data of the search line SL_1, the comparison result of the comparison circuit 220 is "mismatch". At this time, the comparison circuit 220 provides a discharge path to the match line ML2 (from ML2 to VSS through M71. M74 and 231, or from ML2 to VSS through M72, M73 and 231), so that the voltage level of the match line ML2 is pulled down to the low logic level.

When the repair signal BADC_1 indicates that the CAM cell CAM2_1 is defective, the switch 231 is turned off. At this time, the switch 231 may cut off the discharge path to the match line ML2 in the comparison circuit 220 to disable the comparison circuit 220. Therefore, the disabled comparison circuit 220 will not affect the state of the match line ML2.

Figure 8:
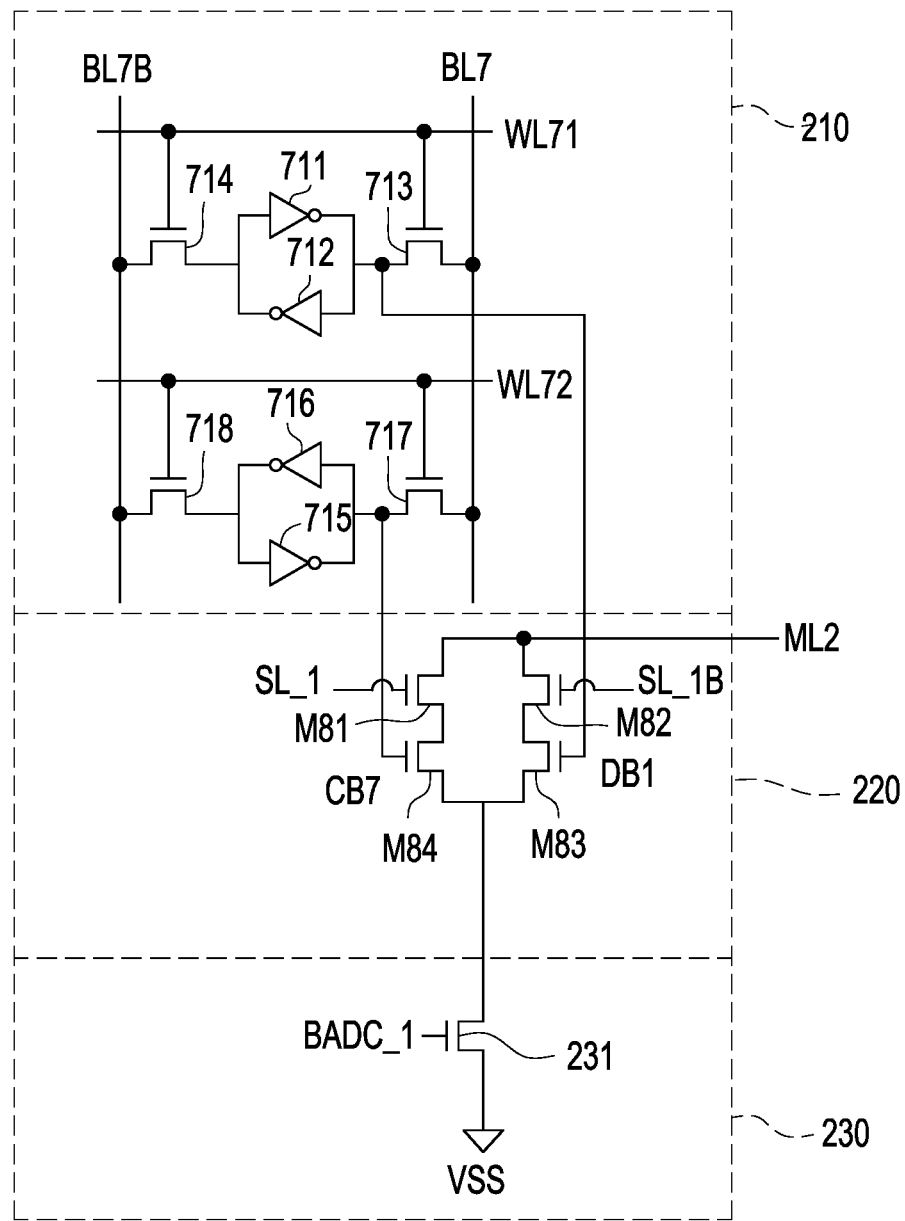
FIG. 8 is a schematic circuit diagram of the CAM cell according to another embodiment of the disclosure.

FIG. 8 is a schematic circuit diagram of the CAM cell CAM2_1 according to another embodiment of the disclosure. The CAM cell CAM2_1 shown in FIG. 8 may be used as another implementation example of the CAM cell CAM2_1 shown in FIG. 2. For the memory cell circuit 210 and the disabling circuit 230 shown in FIG. 8, reference may be made to the related description of the memory cell circuit 210 and the disabling circuit 230 shown in FIG. 7, and details thereof are not repeated. In the embodiment shown in FIG. 8, the comparison circuit 220 includes a transistor M81, a transistor M82, a transistor M83 and a transistor M84. A first terminal of the transistor M81 and a first terminal of the transistor M82 are coupled to the match line ML2. A control terminal of the transistor M81 is coupled to the search line SL_1 to receive the search bit data. A control terminal of the transistor M82 is coupled to the search line SL_1B to receive the inverted search bit data. A first terminal of the transistor M83 is coupled to a second terminal of the transistor M82. A second terminal of the transistor M83 is coupled to the disabling circuit 230. A control terminal of the transistor M83 is coupled to the memory cell circuit to receive the stored bit data DB1. A first terminal of the transistor M84 is coupled to a second terminal of the transistor M81. A second terminal of the transistor M84 is coupled to the disabling circuit 230. A control terminal of the transistor M84 is coupled to the memory cell circuit 210 to receive the care bit data CB7.

In the embodiment of FIG. 8, a first terminal of the switch 231 is coupled to the second terminal of the transistor M83 and the second terminal of the transistor M84. When the repair signal BADC_1 indicates that the CAM cell CAM2_1 is normal, the switch 231 is turned on, so that the comparison circuit 220 presents the comparison result on the match line ML2. When the repair signal BADC_1 indicates that the CAM cell CAM2_1 is defective, the switch 231 is turned off. At this time, the switch 231 may cut off the discharge path to the match line ML2 in the comparison circuit 220 to disable the comparison circuit 220. Therefore, the disabled comparison circuit 220 will not affect the state of the match line ML2.

Figure 9:
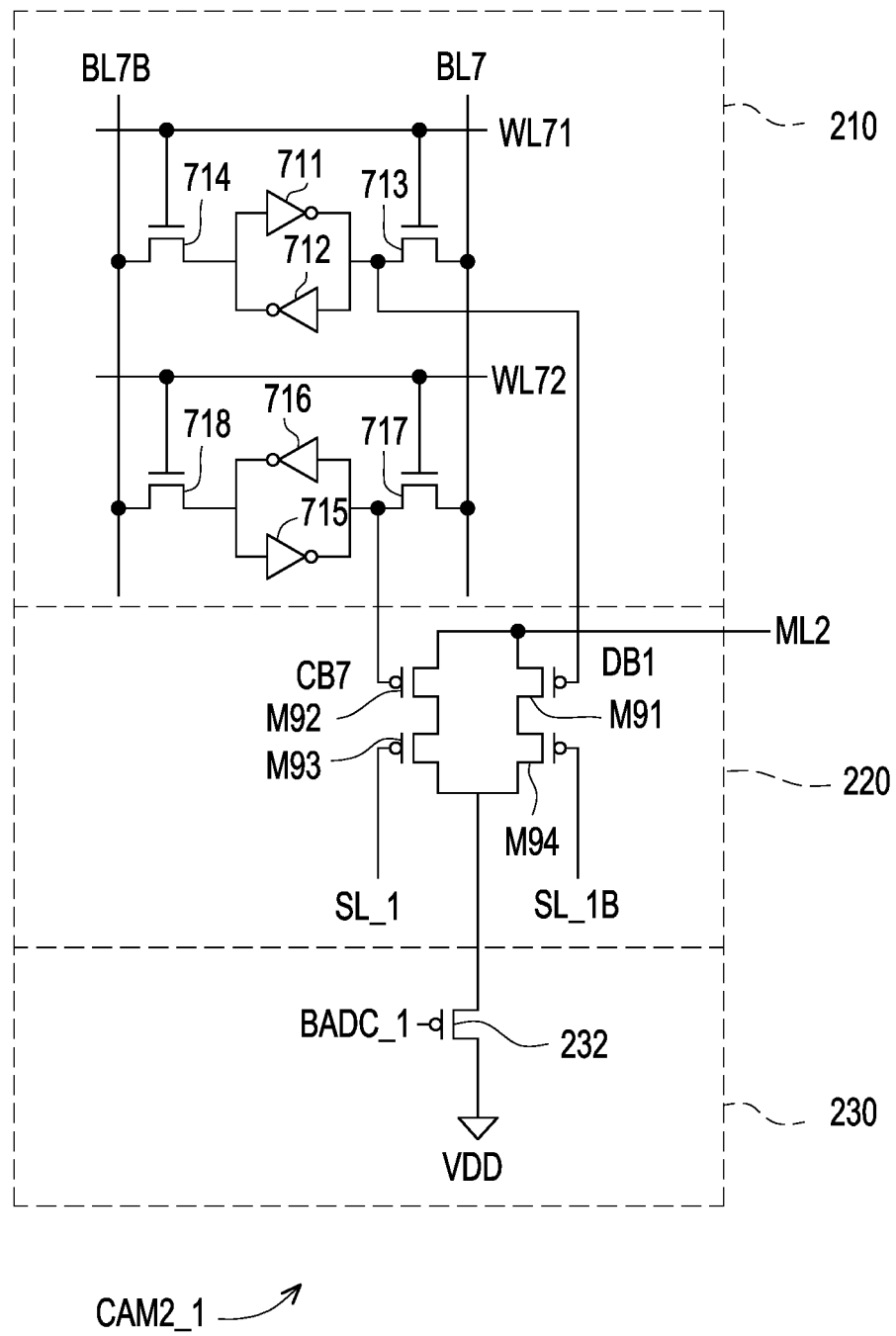
FIG. 9 is a schematic circuit diagram of the CAM cell according to still another embodiment of the disclosure.

FIG. 9 is a schematic circuit diagram of the CAM cell CAM2_1 according to still another embodiment of the disclosure. The CAM cell CAM2_1 shown in FIG. 9 may be used as still another implementation example of the CAM cell CAM2_1 shown in FIG. 2. For the memory cell circuit 210 shown in FIG. 9, reference may be made to the related description of the memory cell circuit 210 shown in FIG. 7, and details thereof are not repeated. In the embodiment shown in FIG. 9, the comparison circuit 220 includes a transistor M91, a transistor M92, a transistor M93 and a transistor M94. A first terminal of the transistor M91 and a first terminal of the transistor M92 are coupled to the match line ML2. A control terminal of the transistor M91 is coupled to the memory cell circuit 210 to receive the stored bit data DB1. A control terminal of the transistor M92 is coupled to the memory cell circuit 210 to receive the care bit data CB7. A first terminal of the transistor M93 is coupled to a second terminal of the transistor M92. A second terminal of the transistor M93 is coupled to the disabling circuit 230. A control terminal of the transistor M93 is coupled to the search line SL_1 to receive the search bit data. A first terminal of the transistor M94 is coupled to a second terminal of the transistor M91. A second terminal of the transistor M94 is coupled to the disabling circuit 230. A control terminal of the transistor M94 is coupled to the search line SL_1B to receive the inverted search bit data.

For the disabling circuit 230 shown in FIG. 9, reference may be made to the related description of the disabling circuit 230 shown in FIG. 5. In the embodiment of FIG. 9, a first terminal of the switch 232 is coupled to the second terminal of the transistor M93 and the second terminal of the transistor M94. When the repair signal BADC_1 indicates that the CAM cell CAM2_1 is normal, the switch 232 is turned on. The match line ML2 is pre-discharged to the low logic level before the comparison operation. In the comparison operation, the comparison circuit 220 may compare the stored bit data DB1, the care bit data CB7, and the search bit data of the search lines SL_1 and SL_1B. When both of the stored bit data DB1 and the care bit data CB7 are logic "1", the state of the CAM cell CAM2_1 is the prohibited state. When both of the stored bit data DB1 and the care bit data CB7 are logic "0", the state of the CAM cell CAM2_1 is the don't care state.

When the stored bit data DB1 is different from the care bit data CB7, the state of the CAM cell CAM2_1 is the comparison state. At this time, when the stored bit data DB1 matches the search bit data of the search line SL_1, the comparison result of the comparison circuit 220 is "match" (the comparison circuit 220 will not affect the state of the match line ML2). When the stored bit data DB1 does not match the search bit data of the search line SL_1, the comparison result of the comparison circuit 220 is "mismatch". At this time, the comparison circuit 220 provides a discharge path to the match line ML2 (from VDD to ML2 through 232, M91 and M94, or from VDD to ML2 through 232. M92 and M93), so that the voltage level of the match line ML2 is pulled up to the high logic level.

When the repair signal BADC_1 indicates that the CAM cell CAM2_1 is defective, the switch 232 is turned off. At this time, the switch 232 may cut off the charge path to the match line ML2 in the comparison circuit 220 to disable the comparison circuit 220. Therefore, the disabled comparison circuit 220 will not affect the state of the match line ML2.

Figure 10:
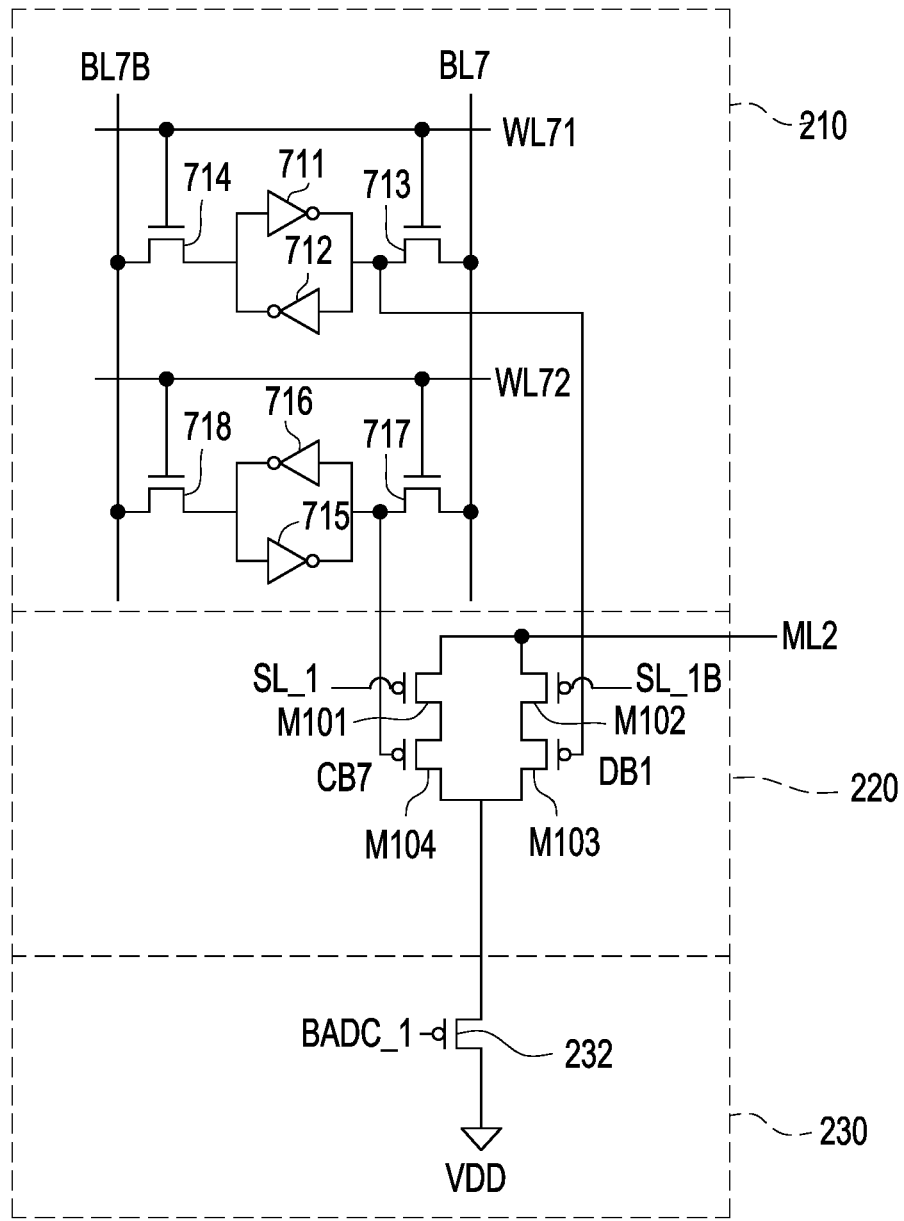
FIG. 10 is a schematic circuit diagram of the CAM cell according to still another embodiment of the disclosure.

FIG. 10 is a schematic circuit diagram of the CAM cell CAM2_1 according to still another embodiment of the disclosure. The CAM cell CAM2_1 shown in FIG. 10 may be used as still another implementation example of the CAM cell CAM2_1 shown in FIG. 2. For the memory cell circuit 210 and the disabling circuit 230 shown in FIG. 10, reference may be made to the related description of the memory cell circuit 210 and the disabling circuit 230 shown in FIG. 9, and details thereof are not repeated. In the embodiment shown in FIG. 10, the comparison circuit 220 includes a transistor M101, a transistor M102, a transistor M103 and a transistor M104. A first terminal of the transistor M101 and a first terminal of the transistor M102 are coupled to the match line ML2. A control terminal of the transistor M101 is coupled to the search line SL_1 to receive the search bit data. A control terminal of the transistor M102 is coupled to the search line SL_1B to receive the inverted search bit data. A first terminal of the transistor M103 is coupled to a second terminal of the transistor M102. A second terminal of the transistor M103 is coupled to the disabling circuit 230. A control terminal of the transistor M103 is coupled to the memory cell circuit 210 to receive the stored bit data DB1. A first terminal of the transistor M104 is coupled to a second terminal of the transistor M101. A second terminal of the transistor M104 is coupled to the disabling circuit 230. A control terminal of the transistor M104 is coupled to the memory cell circuit 210 to receive the care bit data CB7.

In the embodiment of FIG. 10, a first terminal of the switch 232 is coupled to the second terminal of the transistor M103 and the second terminal of the transistor M104. When the repair signal BADC_1 indicates that the CAM cell CAM2_1 is normal, the switch 232 is turned on, so that the comparison circuit 220 presents the comparison result on the match line ML2. When the repair signal BADC_1 indicates that the CAM cell CAM2_1 is defective, the switch 232 is turned off. At this time, the switch 232 may cut off the charge path to the match line ML2 in the comparison circuit 220 to disable the comparison circuit 220. Therefore, the disabled comparison circuit 220 will not affect the state of the match line ML2.

Figure 11:
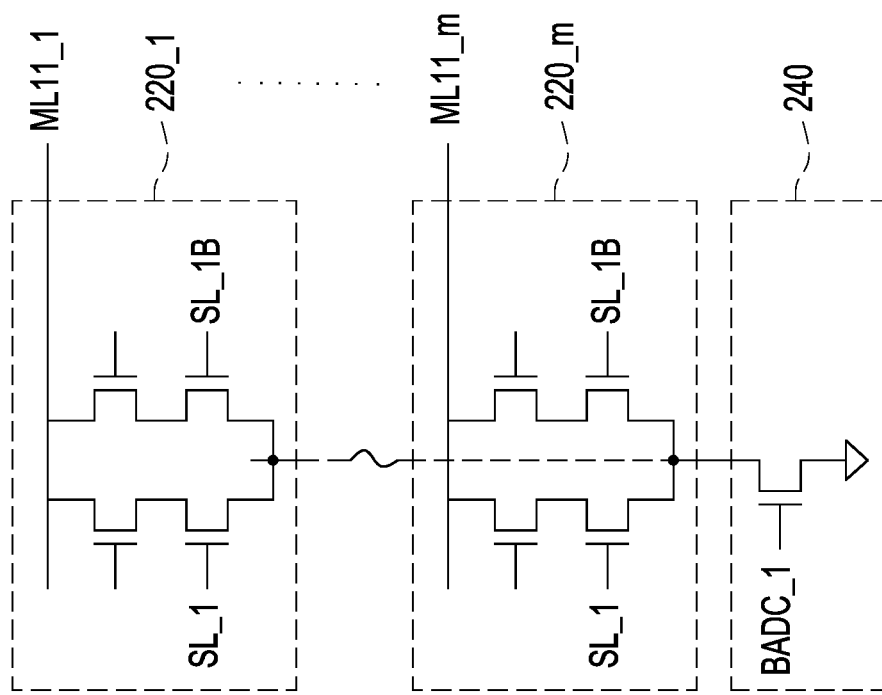
FIG. 11 is a schematic circuit diagram of a CAM according to still another embodiment of the disclosure.

FIG. 11 is a schematic circuit diagram of a CAM according to still another embodiment of the disclosure. FIG. 11 shows comparison circuits 220_1-220_m of multiple CAM cells in a column of a memory cell array. For the comparison circuits 220_1-220_m shown in FIG. 11, reference may be made to the relevant description of the comparison circuit 220 shown in FIG. 3, or reference may be made to the relevant description of the comparison circuit 220 shown in FIG. 7, and details thereof are not repeated here. In the embodiment shown in FIG. 11, the comparison circuits 220_1-220_m of all of the CAM cells in the same column of the memory cell array may share a disabling circuit 240. The disabling circuit 240 is coupled to the comparison circuits 220_1-220_m of all of the CAM cells in the same column of the memory cell array.

For the disabling circuit 240 shown in FIG. 11, reference may be made to the relevant description of the disabling circuit 230 shown in FIG. 3, or reference may be made to the relevant description of the disabling circuit 230 shown in FIG. 7, and details thereof are not repeated. When the repair signal BADC_1 indicates that all of the CAM cells in the same column are normal, the disabling circuit 240 enables the comparison circuits 220_1-220_m of all of the CAM cells in the same column, so that the comparison circuits 220_1-220_m in the same column respectively present the comparison results on different match lines ML11_1-ML11_m. When the repair signal BADC_1 indicates that any one of the CAM cells in the same column is defective, the disabling circuit 240 disables the comparison circuits 220_1-220_m of all of the CAM cells in the same column, so that the disabled comparison circuits 220_1-220_m will not affect the match lines ML11_1-ML11_m.

Figure 12:
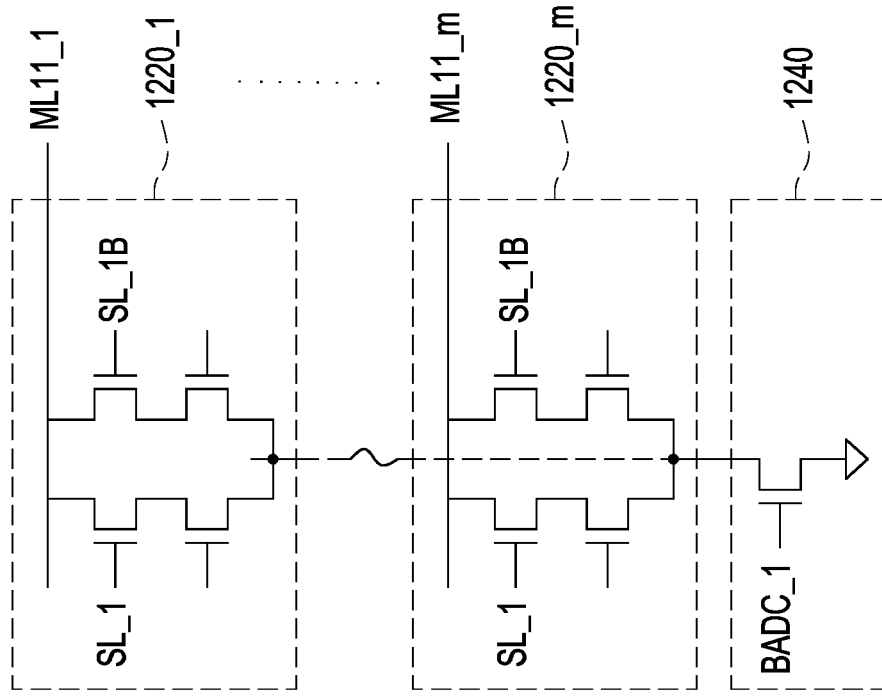
FIG. 12 is a schematic circuit diagram of a CAM according to still another embodiment of the disclosure.

FIG. 12 is a schematic circuit diagram of a CAM according to still another embodiment of the disclosure. FIG. 12 shows comparison circuits 1220_1-1220_m of multiple CAM cells in a column of a memory cell array. For the comparison circuits 1220_1-1220_m shown in FIG. 12, reference may be made to the relevant description of the comparison circuit 220 shown in FIG. 4, or reference may be made to the relevant description of the comparison circuit 220 shown in FIG. 8, and details thereof are not repeated here. In the embodiment shown in FIG. 12, the comparison circuits 1220_1-1220_m of all of the CAM cells in the same column of the memory cell array may share a disabling circuit 1240. The disabling circuit 1240 is coupled to the comparison circuits 1220_1-1220_m of all of the CAM cells in the same column of the memory cell array.

For the disabling circuit 1240 shown in FIG. 12, reference may be made to the relevant description of the disabling circuit 230 shown in FIG. 4, or reference may be made to the relevant description of the disabling circuit 230 shown in FIG. 8, and details thereof are not repeated. When the repair signal BADC_1 indicates that all of the CAM cells in the same column are normal, the disabling circuit 1240 enables the comparison circuits 1220_1-1220_*m* of all of the CAM cells in the same column, so that the comparison circuits 1220_1-1220_*m* in the same column respectively present the comparison results on different match lines ML11_1-ML11_*m*. When the repair signal BADC_1 indicates that any one of the CAM cells in the same column is defective, the disabling circuit 1240 disables the comparison circuits 1220_1-1220_*m* of all of the CAM cells in the same column, so that the disabled comparison circuits 1220_1-1220_*m* will not affect the match lines ML11_1-ML11_*m*.

Figure 13:
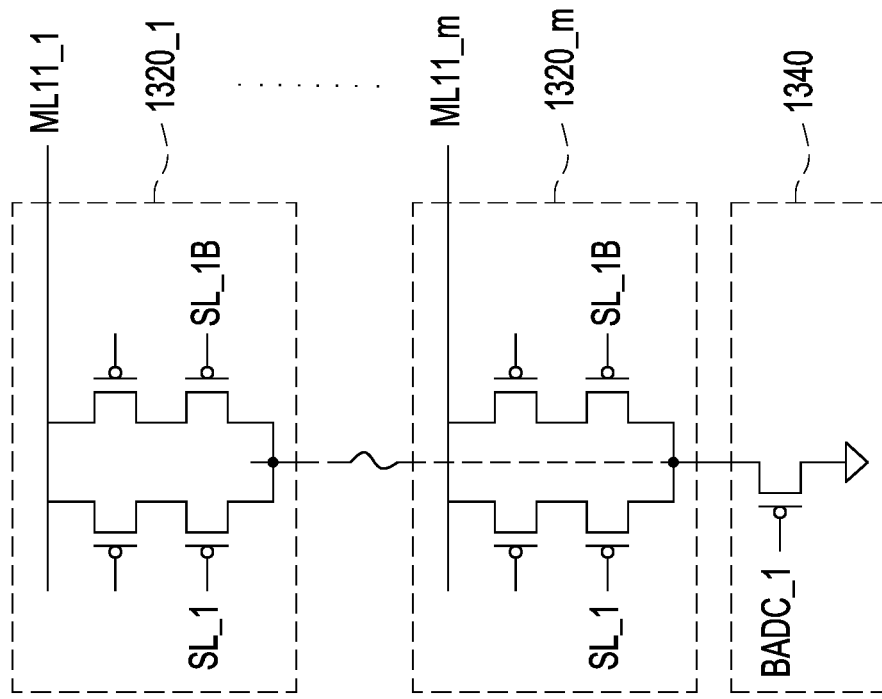
FIG. 13 is a schematic circuit diagram of a CAM according to still another embodiment of the disclosure.

FIG. 13 is a schematic circuit diagram of a CAM according to still another embodiment of the disclosure. FIG. 13 shows comparison circuits 1320_1-1320_*m* of multiple CAM cells in a column of a memory cell array. For the comparison circuits 1320_1-1320_*m* shown in FIG. 13, reference may be made to the relevant description of the comparison circuit 220 shown in FIG. 5, or reference may be made to the relevant description of the comparison circuit 220 shown in FIG. 9, and details thereof are not repeated here. In the embodiment shown in FIG. 13, the comparison circuits 1320_1-1320_*m* of all of the CAM cells in the same column of the memory cell array may share a disabling circuit 1340. The disabling circuit 1340 is coupled to the comparison circuits 1320_1-1320_*m* of all of the CAM cells in the same column of the memory cell array.

For the disabling circuit 1340 shown in FIG. 13, reference may be made to the relevant description of the disabling circuit 230 shown in FIG. 5, or reference may be made to the relevant description of the disabling circuit 230 shown in FIG. 9, and details thereof are not repeated. When the repair signal BADC_1 indicates that all of the CAM cells in the same column are normal, the disabling circuit 1340 enables the comparison circuits 1320_1-1320_*m* of all of the CAM cells in the same column, so that the comparison circuits 1320_1-1320_*m* in the same column respectively present the comparison results on different match lines ML11_1-ML11_*m*. When the repair signal BADC_1 indicates that any one of the CAM cells in the same column is defective, the disabling circuit 1340 disables the comparison circuits 1320_1-1320_*m* of all of the CAM cells in the same column, so that the disabled comparison circuits 1320_1-1320_*m* will not affect the match lines ML11_1-ML11_*m*.

Figure 14:
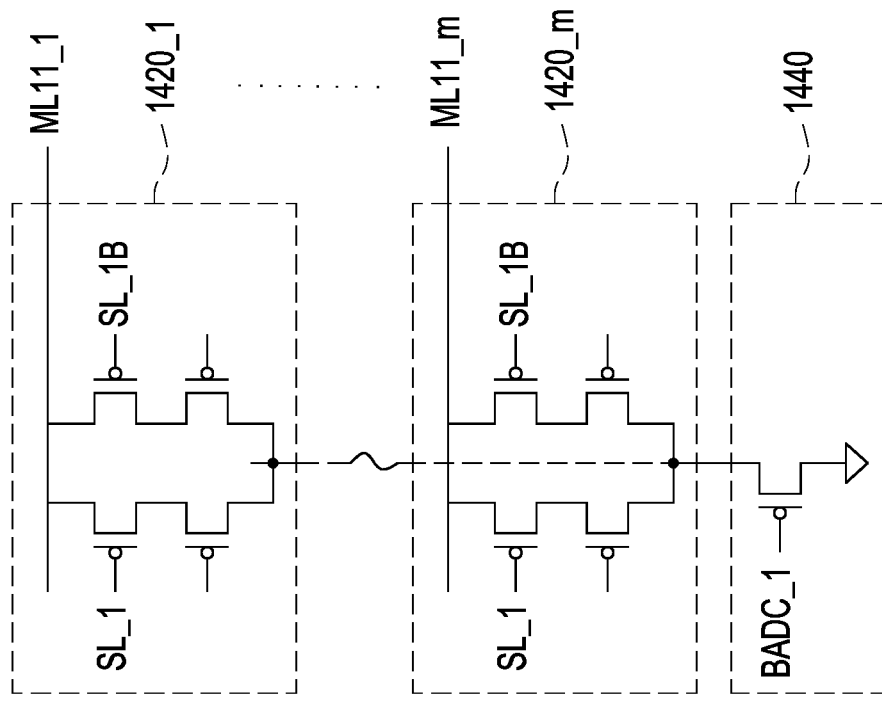
FIG. 14 is a schematic circuit diagram of a CAM according to another embodiment of the disclosure.

FIG. 14 is a schematic circuit diagram of a CAM according to another embodiment of the disclosure. FIG. 14 shows comparison circuits 1420_1-1420_*m* of multiple CAM cells in a column of a memory cell array. For the comparison circuits 1420_1-1420_*m* shown in FIG. 14, reference may be made to the relevant description of the comparison circuit 220 shown in FIG. 6, or reference may be made to the relevant description of the comparison circuit 220 shown in FIG. 10, and details thereof are not repeated here. In the embodiment shown in FIG. 14, the comparison circuits 1420_1-1420_*m* of all of the CAM cells in the same column of the memory cell array may share a disabling circuit 1440. The disabling circuit 1440 is coupled to the comparison circuits 1420_1-1420_*m* of all of the CAM cells in the same column of the memory cell array.

For the disabling circuit 1440 shown in FIG. 14, reference may be made to the relevant description of the disabling circuit 230 shown in FIG. 6, or reference may be made to the relevant description of the disabling circuit 230 shown in FIG. 10, and details thereof are not repeated. When the repair signal BADC_1 indicates that all of the CAM cells in the same column are normal, the disabling circuit 1440 enables the comparison circuits 1420_1-1420_*m* of all of the CAM cells in the same column, so that the comparison circuits 1420_1-1420_*m* in the same column respectively present the comparison results on different match lines ML11_1-ML11_*m*. When the repair signal BADC_1 indicates that any one of the CAM cells in the same column is defective, the disabling circuit 1440 disables the comparison circuits 1420_1-1420_*m* of all of the CAM cells in the same column, so that the disabled comparison circuits 1420_1-1420_*m* will not affect the match lines ML11_1-ML11_*m*.

In summary, the CAM 100 described in the embodiments of the disclosure is configured with the disabling circuit. In some embodiments, each of the CAM cells has its own dedicated disabling circuit 230. When the repair signal indicates that the CAM cell is defective, the disabling circuit may disable the comparison circuit 220 of the CAM cell. For example, the disabling circuit may cut off a discharge/charge path to the match line in the comparison circuit 220 to disable the comparison circuit 220. Therefore, the disabled comparison circuit 220 will not affect signal transmission of the match line. In other embodiments, multiple CAM cells (for example, all of the CAM cells in the first column of the memory cell array) may share one disabling circuit 240. When the repair signal indicates that any one of the CAM cells in the same column is defective, the disabling circuit 240 may disable the comparison circuits of all of the CAM cells in the same column.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A content addressable memory, comprising:
a memory cell array, comprising a plurality of content addressable memory cells, wherein each of the content addressable memory cells comprises a memory cell circuit and a comparison circuit; and
a disabling circuit, coupled to the comparison circuits of the content addressable memory cells in a first column of the memory cell array, wherein the disabling circuit is controlled by a repair signal, wherein
in response to the repair signal indicating that the content addressable memory cells in the first column are normal, the disabling circuit enables the comparison circuits of the content addressable memory cells in the first column, so that the comparison circuits in the first column respectively present comparison results on different match lines,
in response to the repair signal indicating that any one of the content addressable memory cells in the first column is defective, the disabling circuit disables the comparison circuits of the content addressable memory cells in the first column, so that the disabled comparison circuits do not affect the different match lines.

2. The content addressable memory according to claim 1, wherein in a first content addressable memory cell of the content addressable memory cells in the first column, the comparison circuit is coupled to the memory cell circuit to receive stored bit data, the comparison circuit is coupled to a first search line to receive search bit data, and the comparison circuit is coupled to a corresponding match line in the different match lines,
in response to the repair signal indicating that the content addressable memory cells in the first column are normal, the disabling circuit enables the comparison circuit, so that the comparison circuit present a comparison result of the stored bit data and the search bit data on the corresponding match line; and in response to the repair signal indicating that the content addressable memory cells in the first column are defective, the disabling circuit disables the comparison circuit so that the comparison circuit does not affect the corresponding match line.

3. The content addressable memory according to claim 2, wherein the memory cell circuit in the first content addressable memory cell comprises:

a first NOT gate, having an output terminal coupled to the comparison circuit to provide the stored bit data;

a second NOT gate, having an output terminal coupled to an input terminal of the first NOT gate, wherein an input terminal of the second NOT gate is coupled to the output terminal of the first NOT gate;

a first switch, having a first terminal coupled to the output terminal of the first NOT gate, wherein a second terminal of the first switch is coupled to a bit line, and a control terminal of the first switch coupled to a first word line; and a second switch, having a first terminal coupled to the output terminal of the second NOT gate to receive inverted stored bit data, wherein a second terminal of the second switch is coupled to an inverted bit line, and a control terminal of the second switch is coupled to the first word line.

4. The content addressable memory according to claim 3, wherein the memory cell circuit in the first content addressable memory cell further comprises:

a third NOT gate, having an output terminal coupled to the comparison circuit to provide care bit data;

a fourth NOT gate, having an output terminal coupled to an input terminal of the third NOT gate, wherein an input terminal of the fourth NOT gate is coupled to the output terminal of the third NOT gate;

a third switch, having a first terminal coupled to the output terminal of the third NOT gate, wherein a second terminal of the third switch is coupled to the bit line, and a control terminal of the third switch is coupled to a second word line; and a fourth switch, having a first terminal coupled to the output terminal of the fourth NOT gate, wherein a second terminal of the fourth switch is coupled to the inverted bit line, and a control terminal of the fourth switch is coupled to the second word line.

5. The content addressable memory according to claim 2, wherein the comparison circuit in the first content addressable memory cell comprises:

a first transistor, having a first terminal coupled to the corresponding match line, wherein a control terminal of the first transistor is coupled to the memory cell circuit to receive the stored bit data;

a second transistor, having a first terminal coupled to the corresponding match line, wherein a control terminal of the second transistor is coupled to the memory cell circuit to receive inverted stored bit data or care bit data;

a third transistor, having a first terminal coupled to a second terminal of the second transistor, wherein a second terminal of the third transistor is coupled to the disabling circuit, and a control terminal of the third transistor is coupled to the first search line to receive the search bit data; and a fourth transistor, having a first terminal coupled to a second terminal of the first transistor, wherein a second terminal of the fourth transistor is coupled to the disabling circuit, and a control terminal of the fourth transistor is coupled to a second search line to receive inverted search bit data.

6. The content addressable memory according to claim 2, wherein the comparison circuit in the first content addressable memory cell comprises:

a first transistor, having a first terminal coupled to the corresponding match line, wherein a control terminal of the first transistor is coupled to the first search line to receive the search bit data;

a second transistor, having a first terminal coupled to the corresponding match line, wherein a control terminal of the second transistor is coupled to a second search line to receive inverted search bit data;

a third transistor, having a first terminal coupled to a second terminal of the second transistor, wherein a second terminal of the third transistor is coupled to the disabling circuit, and a control terminal of the third transistor is coupled to the memory cell circuit to receive the stored bit data; and a fourth transistor, having a first terminal coupled to a second terminal of the first transistor, wherein a second terminal of the fourth transistor is coupled to the disabling circuit, and a control terminal of the fourth transistor is coupled to the memory cell circuit to receive inverted stored bit data or care bit data.

7. The content addressable memory according to claim 2, wherein the disabling circuit comprises:

a switch, having a first terminal coupled to the comparison circuit, wherein a second terminal of the switch is coupled to a power voltage line or a reference voltage line, in response to the repair signal indicating that the content addressable memory cell is normal, the switch is turned on, and in response to the repair signal indicating that the content addressable memory cell is defective, the switch is turned off.

8. A content addressable memory cell, comprising:

a memory cell circuit;

a comparison circuit, coupled to the memory cell circuit to receive stored bit data and coupled to a first search line to receive search bit data, wherein the comparison circuit is further coupled to a match line; and a disabling circuit, coupled to the comparison circuit, wherein the disabling circuit is controlled by a repair signal, wherein in response to the repair signal indicating that the content addressable memory cell is normal, the disabling circuit enables the comparison circuit, so that the comparison circuit presents a comparison result of the stored bit data and the search bit data on the match line, and in response to the repair signal indicating that the content addressable memory cell is defective, the disabling circuit disables the comparison circuit, so that the comparison circuit does not affect the match line.

9. The content addressable memory cell according to claim 8, wherein the memory cell circuit comprises:

a first NOT gate, having an output terminal coupled to the comparison circuit to provide the stored bit data;

a second NOT gate, having an output terminal coupled to an input terminal of the first NOT gate, wherein an input terminal of the second NOT gate is coupled to the output terminal of the first NOT gate;

a first switch, having a first terminal coupled to the output terminal of the first NOT gate, wherein a second terminal of the first switch is coupled to a bit line, and a control terminal of the first switch coupled to a first word line; and a second switch, having a first terminal coupled to the output terminal of the second NOT gate to receive inverted stored bit data, wherein a second terminal of the second switch is coupled to an inverted bit line, and a control terminal of the second switch is coupled to the first word line.

10. The content addressable memory cell according to claim 9, wherein the memory cell circuit further comprises:

a third NOT gate, having an output terminal coupled to the comparison circuit to provide care bit data;

a fourth NOT gate, having an output terminal coupled to an input terminal of the third NOT gate, wherein an input terminal of the fourth NOT gate is coupled to the output terminal of the third NOT gate;

a third switch, having a first terminal coupled to the output terminal of the third NOT gate, wherein a second terminal of the third switch is coupled to the bit line, and a control terminal of the third switch is coupled to a second word line; and a fourth switch, having a first terminal coupled to the output terminal of the fourth NOT gate, wherein a second terminal of the fourth switch is coupled to the inverted bit line, and a control terminal of the fourth switch is coupled to the second word line.

11. The content addressable memory cell according to claim 8, wherein the comparison circuit comprises:

a first transistor, having a first terminal coupled to the match line, wherein a control terminal of the first transistor is coupled to the memory cell circuit to receive the stored bit data;

a second transistor, having a first terminal coupled to the match line, wherein a control terminal of the second transistor is coupled to the memory cell circuit to receive inverted stored bit data or care bit data;

a third transistor, having a first terminal coupled to a second terminal of the second transistor, wherein a second terminal of the third transistor is coupled to the disabling circuit, and a control terminal of the third transistor is coupled to the first search line to receive the search bit data; and a fourth transistor, having a first terminal coupled to a second terminal of the first transistor, wherein a second terminal of the fourth transistor is coupled to the disabling circuit, and a control terminal of the fourth transistor is coupled to a second search line to receive inverted search bit data.

12. The content addressable memory cell according to claim 8, wherein the comparison circuit comprises:

a first transistor, having a first terminal coupled to the match line, wherein a control terminal of the first transistor is coupled to the first search line to receive the search bit data;

a second transistor, having a first terminal coupled to the match line, wherein a control terminal of the second transistor is coupled to a second search line to receive inverted search bit data;

a third transistor, having a first terminal coupled to a second terminal of the second transistor, wherein a second terminal of the third transistor is coupled to the disabling circuit, and a control terminal of the third transistor is coupled to the memory cell circuit to receive the stored bit data; and a fourth transistor, having a first terminal coupled to a second terminal of the first transistor, wherein a second terminal of the fourth transistor is coupled to the disabling circuit, and a control terminal of the fourth transistor is coupled to the memory cell circuit to receive inverted stored bit data or care bit data.

13. The content addressable memory cell according to claim 8, wherein the disabling circuit comprises:

a switch, having a first terminal coupled to the comparison circuit, wherein a second terminal of the switch is coupled to a power voltage line or a reference voltage line, in response to the repair signal indicating that the content addressable memory cell is normal, the switch is turned on, and in response to the repair signal indicating that the content addressable memory cell is defective, the switch is turned off.

* * * * *